(12) United States Patent
Lin et al.

(10) Patent No.: US 11,404,134 B2
(45) Date of Patent: Aug. 2, 2022

(54) MEMORY DEVICE TEST CIRCUIT AND MEMORY DEVICE TEST METHOD

(71) Applicant: REALTEK SEMICONDUCTOR CORPORATION, Hsinchu (TW)

(72) Inventors: Sheng-Lin Lin, Taichung (TW); Shih-Chieh Lin, Taoyuan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 102 days.

(21) Appl. No.: 16/924,620

(22) Filed: Jul. 9, 2020

(65) Prior Publication Data

US 2021/0027854 A1    Jan. 28, 2021

(30) Foreign Application Priority Data

Jul. 25, 2019 (TW) ................................ 108126394

(51) Int. Cl.
  *G11C 29/38*    (2006.01)
  *G06F 1/3234*   (2019.01)

(52) U.S. Cl.
  CPC ............ *G11C 29/38* (2013.01); *G06F 1/3275* (2013.01)

(58) Field of Classification Search
  None
  See application file for complete search history.

(56) References Cited

U.S. PATENT DOCUMENTS

| 5,173,906 A | * | 12/1992 | Dreibelbis | .............. G06F 11/27 |
| | | | | 714/733 |
| 5,553,082 A | | 9/1996 | Connor | |
| 8,090,965 B1 | * | 1/2012 | Chakravarty | ......... G06F 11/267 |
| | | | | 713/300 |
| 2014/0119147 A1 | | 5/2014 | Stephani et al. | |
| 2016/0111170 A1 | * | 4/2016 | Zhao | .................. G01R 31/3177 |
| | | | | 714/719 |
| 2016/0231797 A1 | * | 8/2016 | Meir | ...................... G06F 1/3287 |
| 2016/0365157 A1 | * | 12/2016 | Sang | .............. G01R 31/318597 |

OTHER PUBLICATIONS

Taiwan Intellectual Property Office, Office Action letter of the counterpart TW application (appl. No. 108126394) dated May 6, 2020. English translation of summary on p. 1.

* cited by examiner

*Primary Examiner* — April Y Blair
*Assistant Examiner* — Matthew W Wahlin
(74) *Attorney, Agent, or Firm* — WPAT, PC

(57) ABSTRACT

A memory device test circuit and a memory device test method are provided. The memory device test circuit is configured to test a memory device and includes a storage circuit, a comparison circuit and a control circuit. The storage circuit stores a test data. The comparison circuit is coupled to the storage circuit. The control circuit is coupled to the storage circuit, the comparison circuit, and the memory device and performs the following steps to test the memory device: writing the test data to the memory device; controlling the memory device to enter a power mode; controlling the memory device to enter a function mode; and controlling the comparison circuit to compare an output data of the memory device with the test data.

8 Claims, 4 Drawing Sheets

MEMORY DEVICE TEST CIRCUIT AND MEMORY DEVICE TEST METHOD

BACKGROUND OF THE INVENTION

1. Field of the Invention

The present invention generally relates to memory devices, and, more particularly, to memory device test circuits and memory device test methods.

2. Description of Related Art

In order to reduce the standby power consumption of a system on a chip (SoC) and to retain the value stored in the memory device, a power mode is usually included in a circuit for control purpose. For memories, the power mode of a memory includes a light sleep mode and a deep sleep mode. Despite of the capability of performing tests in the memory's function mode, a conventional built-in self-test (BIST) circuit fails to test the memory, after the memory goes back to the function mode from the power mode, to find out whether a logic value which the memory should retain is lost due to unwanted adverse influences of the power mode. Therefore, a BIST circuit capable of testing the power mode of the memory is needed.

SUMMARY OF THE INVENTION

In view of the issues of the prior art, an object of the present invention is to provide a memory device test circuit and a memory device test method to test the power mode of a memory device.

A memory device test circuit for testing a memory device is provided. The memory device test circuit includes a storage circuit, a comparison circuit and a control circuit. The storage circuit stores a test data. The comparison circuit is coupled to the storage circuit. The control circuit is coupled to the storage circuit, the comparison circuit and the memory device and configured to perform the following steps to test the memory device: writing the test data into the memory device; controlling the memory device to enter a power mode; controlling the memory device to enter a function mode; and controlling the comparison circuit to compare an output data of the memory device with the test data.

A method for testing a memory device is also provided. The method includes the following steps: writing a test data into the memory device; controlling the memory device to enter a power mode; controlling the memory device to enter a function mode; and comparing an output data of the memory device with the test data.

The memory device test circuit and the memory device test method of the present invention can test the power mode of the memory device, as well as flexibly adjust, according to the type, design and application and test requirements of the memory device, the duration the memory device operates in the power mode and the length of the wake-up period, which is a transition as the memory device returns to the function mode from the power mode. Compared with the conventional technology, the present invention can test the memory device in a more comprehensive and thorough manner.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a memory device test circuit and a memory device test method. On account of that some or all elements of the memory device test circuit could be known, the detail of such elements is omitted provided that such detail has little to do with the features of this disclosure, and that this omission nowhere dissatisfies the specification and enablement requirements. Some or all of the processes of the memory device test method may be implemented by software and/or firmware, and can be performed by the memory device test circuit or its equivalent. A person having ordinary skill in the art can choose components or steps equivalent to those described in this specification to carry out the present invention, which means that the scope of this invention is not limited to the embodiments in the specification.

In the following description, signals are active-high, which means that signals are active at high levels and inactive at low levels, and that asserting/de-asserting a signal means setting the signal high/low. This is for the purpose of explanation, not for limiting the scope of the invention. In other words, in an alternative implementation, signals can be active-low, which means that signals are active at low levels and inactive at high levels, and that asserting/de-asserting a signal means setting the signal low/high. A level transition or a logic level transition means that a signal changes from an asserted (active) state to a de-asserted (inactive) state, or from a de-asserted (inactive) state to an asserted (active) state.

Figure 1:
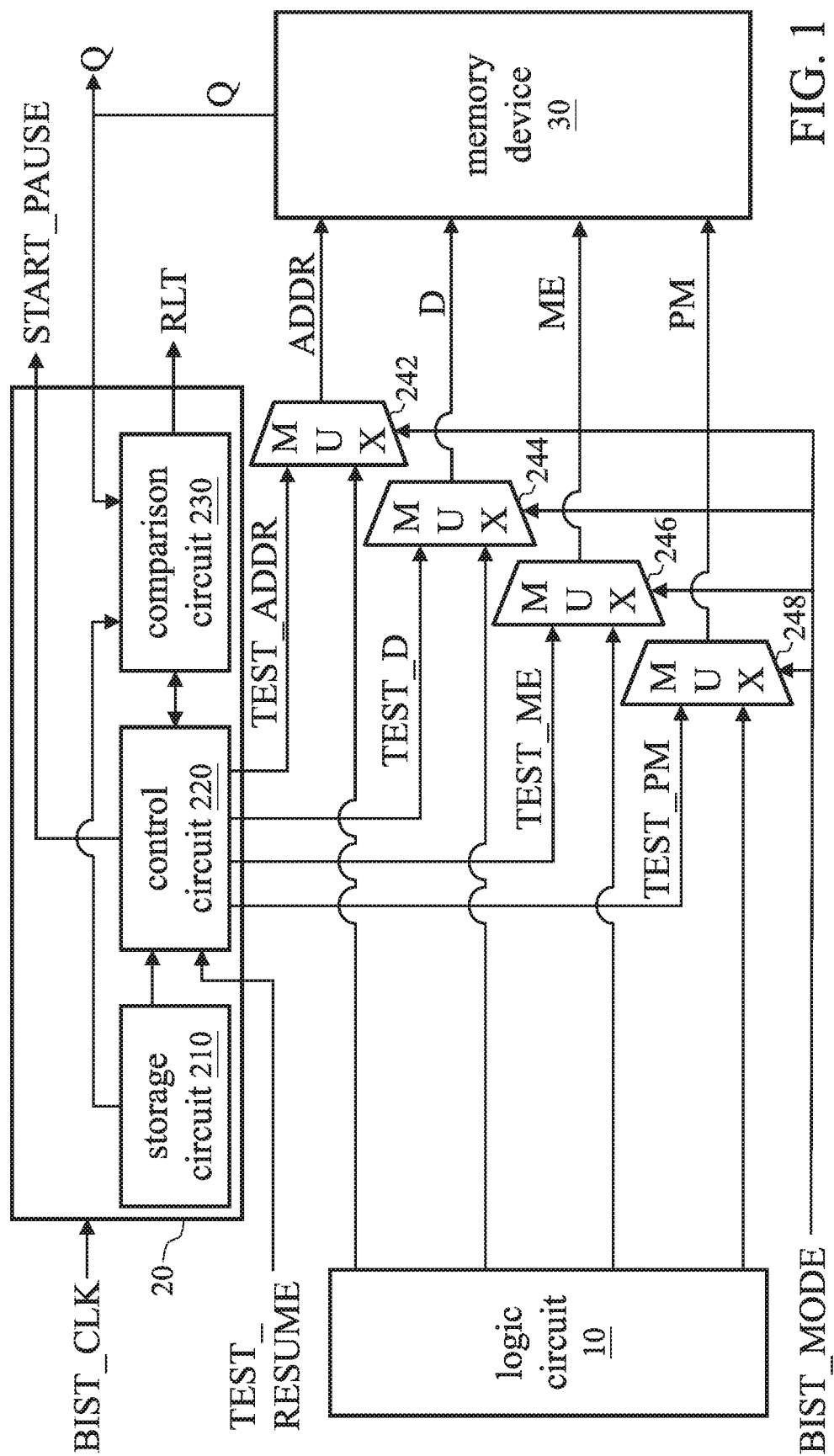
FIG. 1 illustrates a functional block diagram of a built-in self-test (BIST) circuit for a memory device according to an embodiment of the present invention.

FIG. 1 is a functional block diagram of a built-in self-test (BIST) circuit for a memory device according to an embodiment of the present invention. The memory device test circuit 20 is coupled to the memory device 30 and is used for testing the memory device 30. The memory device test circuit 20 includes a storage circuit 210, a control circuit 220, and a comparison circuit 230. In the normal operation, the logic circuit 10, which may include a memory device control circuit, controls the memory device 30 with an address signal ADDR, a memory device enable/disable signal ME and a memory device mode control signal PM. The input data D is data to be written into the memory device 30, and the output data Q is data read from the memory device 30. In the test mode, the control circuit 220 of the memory device test circuit 20 controls or operates the memory device 30 with the address signal TEST_ADDR, the memory device enable/disable signal TEST_ME and the memory device mode control signal TEST_PM. When the memory device 30 is enabled, it can be accessed (read and/or write), and when the memory device 30 is disabled, it cannot be accessed. The memory device mode control signal PM/TEST_PM can not only control the memory device 30 to enter a power mode, but also further control the memory device 30 to enter different types of power modes: the light sleep mode or the deep sleep mode.

Figure 2:
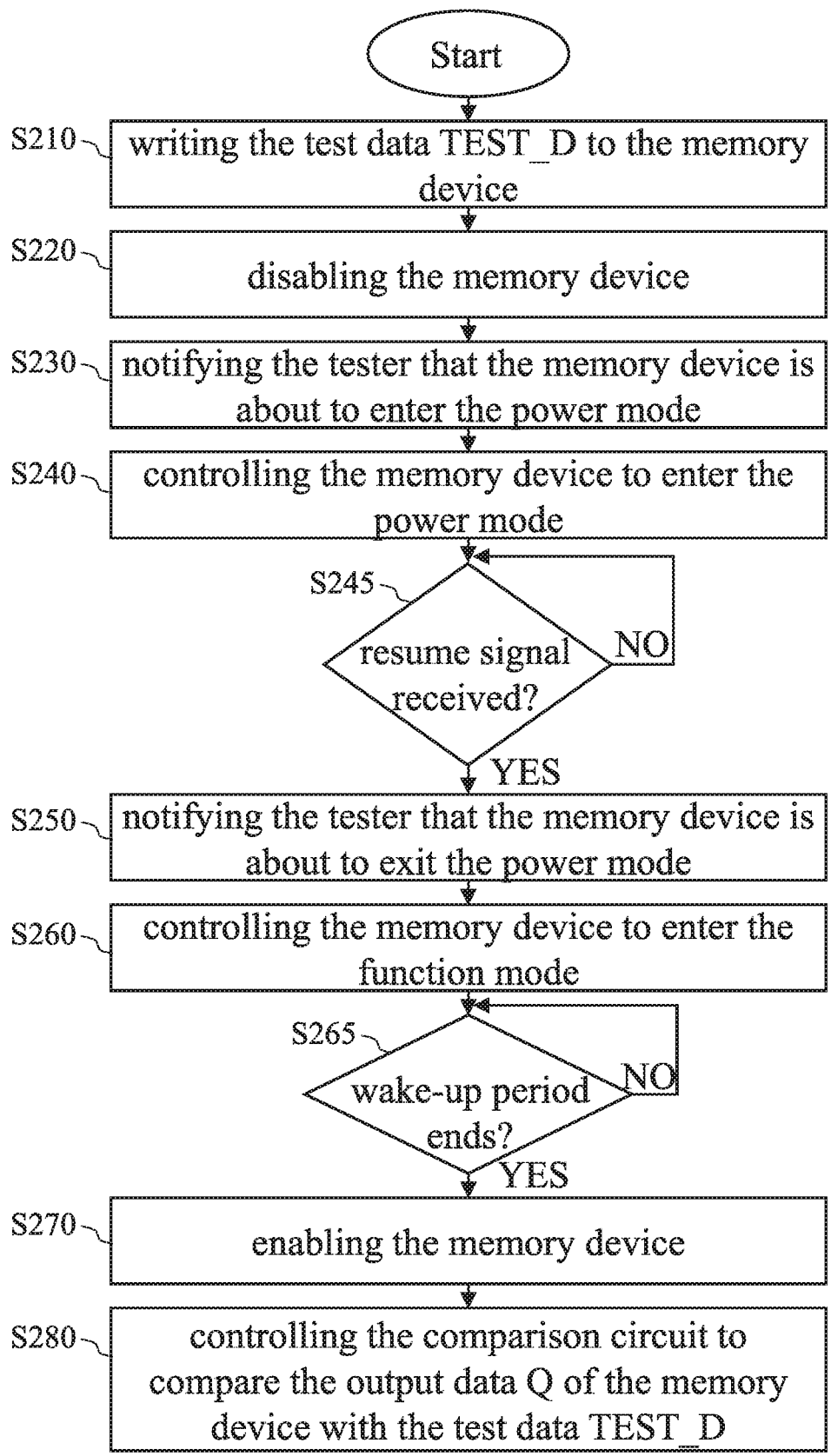
FIG. 2 illustrates a flowchart of a memory device test method according to the present invention.
Figure 3:
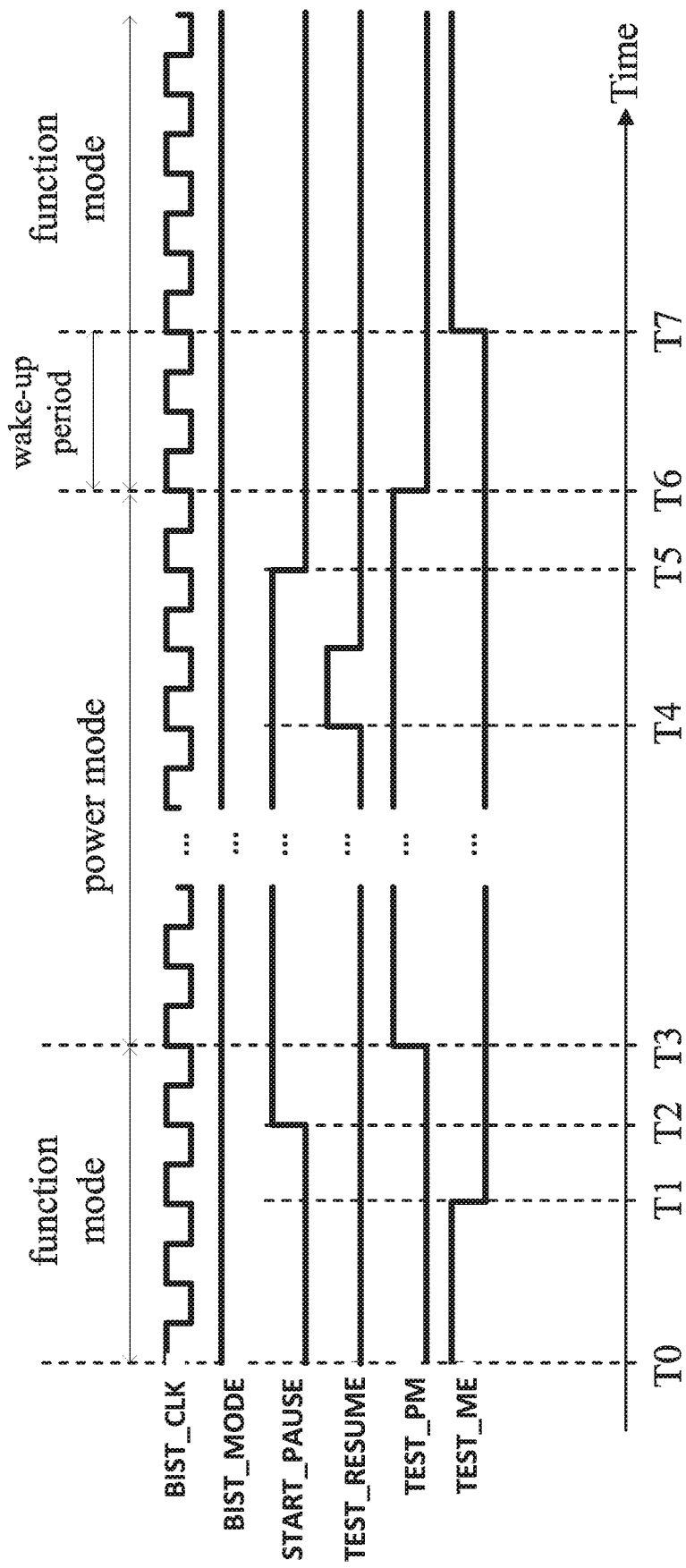
FIG. 3 illustrates a timing diagram of the main signals in FIG. 1.

The test start signal BIST_MODE controls the multiplexers (MUXs) 242 to 248 to either output the signals generated by the logic circuit 10 or output the signals generated by the memory device test circuit 20; that is, whether the memory device 30 is controlled by the logic circuit 10 (i.e., the normal operation) or by the control circuit 220 (i.e., the test mode) is determined by the test start signal BIST_MODE. The memory device test circuit 20 operates in accordance with the clock BIST_CLK. FIG. 2 is a flowchart of a memory device test method according to the present invention, and FIG. 3 is a timing diagram of the main signals in FIG. 1. Reference is made to FIGS. 1 to 3 for the following discussion.

When the test starts (the test start signal BIST_MODE is at the high level), the control circuit 220 controls the memory device 30 to operate in the function mode (i.e., by controlling the memory device mode control signal TEST_PM to the low level), enables the memory device 30 (i.e., by controlling the memory device enable/disable signal TEST_ME to the high level), and writes the test data TEST_D stored in the storage circuit 210 to the memory device 30 (step S210, between time points T0 to T1). After writing the test data TEST_D, the control circuit 220 disables the memory device 30 by controlling the memory device enable/disable signal TEST_ME to the low level (step S220, time point T1). Next, the control circuit 220 notifies the tester that the memory device 30 is about to enter a power mode by controlling the test notification signal START_PAUSE to the high level (step S230, time point T2), and then controls the memory device 30 to enter the power mode (which may be the light sleep mode or the deep sleep mode) by controlling the memory device mode control signal TEST_PM to the high level (step S240, time point T3). The tester can start timing after knowing that the memory device 30 is about to enter the power mode. The purpose of timing is to control the duration for which the memory device 30 operates in the power mode. After that, by sending a resume signal TEST_RESUME to the memory device test circuit 20, the tester gives instructions that the memory device test circuit 20 should end the power mode. In other words, the control circuit 220 does not operate in step S245 (i.e., between the time points T3 and T4) until it receives the resume signal TEST_RESUME. Between the time points T3 and T4, the memory device 30 contains the test data TEST_D and operates in the power mode.

After receiving the resume signal TEST_RESUME (step S245 being positive, time point T4), the control circuit 220 notifies the tester that the memory device 30 is about to exit the power mode by controlling the test notification signal START_PAUSE to the low level (step S250, time point T5). The tester can calculate, according to the test notification signal START_PAUSE, the duration for which the memory device 30 operates in the power mode during the test. Next, the control circuit 220 controls the memory device 30 to enter the function mode by controlling the memory device mode control signal TEST_PM to the low level (step S260, time point T6). A wake-up period is needed for the memory device 30 to return to the function mode from the power mode to ensure that the memory device 30 and/or its peripheral circuits return to the normal operation state. Therefore, the control circuit 220 waits in step S265 until the wake-up period ends. (step S265 being positive). In some embodiments, the set value associated with the wake-up period is stored in the storage circuit 210, and the control circuit 220 controls when to end the wake-up period according to the set value and the clock BIST_CLK and enables the memory device 30 after the wake-up period ends by controlling the memory device enable/disable signal TEST_ME to the high level (step S270, time point T7). In some embodiments, the set value may be a preset number of the cycles of the clock BIST_CLK and may be stored by the tester into the storage circuit 210 of the memory device test circuit 20 before testing.

After the memory device 30 is enabled again, the memory device test circuit 20 accesses the memory device 30, and the control circuit 220 controls the comparison circuit 230 to compare the output data Q of the memory device 30 with the test data TEST_D (step S280). The memory device 30 passes the test if the output data Q is the same as the test data TEST_D. On the contrary, the memory device 30 does not pass the test if the output data Q is different from the test data TEST_D. The comparison circuit 230 may indicate whether the memory device 30 passes the test by outputting the comparison result RLT. In the normal operation, the output data Q of the memory device 30 can be processed by a following output logic circuit (not shown).

Figure 4:
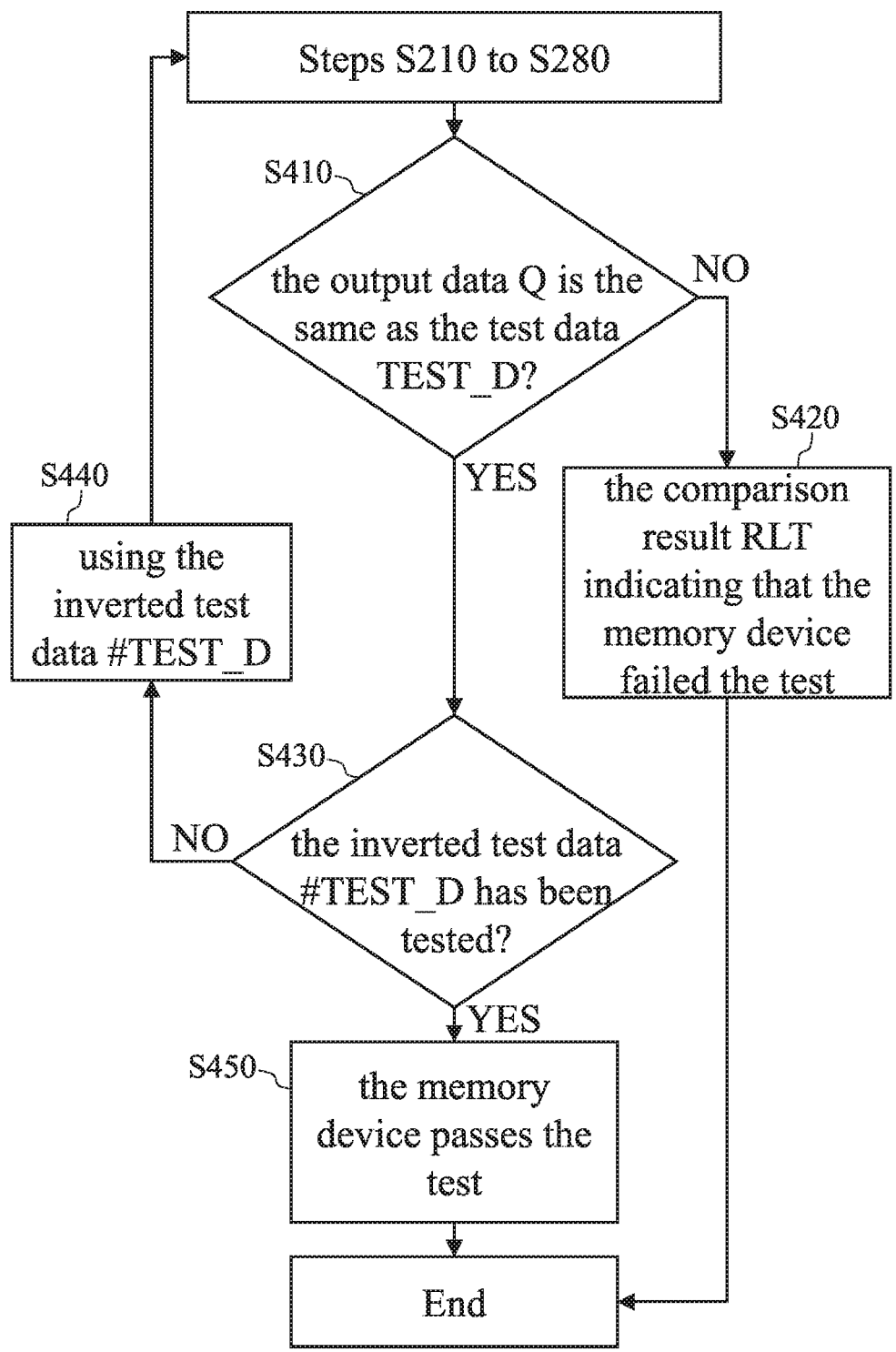
FIG. 4 illustrates a flowchart of a memory device test method according to the present invention.

In some embodiments, the memory device test circuit 20 may use the inverted data of the test data TEST_D to perform the process of FIG. 2 again (i.e., steps S210 to S280) to further test the memory device 30. Reference is made to FIG. 4, which is a flowchart of a memory device test method according to the present invention. After the process of FIG. 2 ends, when the output data Q is different from the test data TEST_D (step S410 being negative), the comparison result RLT indicates that the memory device failed the test (step S420); when the output data Q is the same as the test data TEST_D (step S410 being positive), the control circuit 220 determines whether the memory device 30 has been tested using the inverted test data #TEST_D of the test data TEST_D (step S430). If the inverted test data #TEST_D has not been tested (step S430 being negative), the control circuit 220 uses the inverted test data #TEST_D (step S440) to perform the process of FIG. 2 again (i.e., steps S210 to 280). If the inverted test data #TEST_D has been tested (step S430 being positive), it means that the memory device passes the test (step S450), and the test process can be ended. In step S440, the control circuit 220 may read the inverted test data #TEST_D from the storage circuit 210, or generate the inverted test data #TEST_D by inverting the original test data TEST_D. Logic 1 and logic 0 are each other's inverted data.

The present invention can not only test the power mode of the memory device 30, but also flexibly adjust or set the duration for which the memory device 30 operates in the power mode and the length of the wake-up period of the memory device 30. More specifically, the tester can control the duration of the power mode by inputting the resume signal TEST_RESUME to the memory device test circuit 20 at any time, and adjust the length of the wake-up period by changing the set value. The length of the wake-up period (i.e., the set value) can be set according to the type of the memory device 30 and/or the type of the power mode. For example, testers can give different set values for different types of static random-access memories (SRAMs), and can give different set values for the light sleep mode and the deep sleep mode. In some embodiments, the length of the wake-up period for the deep sleep mode is greater than the length of the wake-up period for the light sleep mode.

The storage circuit 210 can be a memory or a register. The control circuit 220 can be a finite state machine (FSM) made up of multiple logic circuits. People having ordinary skill in the art can implement the FSM according to the flow of FIG. 2. The comparison circuit 230 is well known to people having ordinary skill in the art, and its details are omitted for brevity.

Please note that in some embodiments, steps S220, S265, and S270 can be omitted, that is, the present invention may skip the test of whether the memory device is affected by the wake-up period, and merely tests the power mode of the memory device.

Since a person having ordinary skill in the art can appreciate the implementation detail and the modification thereto of the present method invention through the disclosure of the device invention, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention. Although the foregoing embodiments take memories as an example, the present invention is not limited thereto. Based on the embodiments discussed above, people having ordinary skill in the art can apply the present invention to other types of memory devices, such as registers.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A memory device test circuit for testing a memory device, comprising:
    a storage circuit for storing a test data;
    a comparison circuit coupled to the storage circuit;
    a control circuit coupled to the storage circuit, the comparison circuit and the memory device and configured to perform following steps to test the memory device:
    (A) writing the test data into the memory device;
    (B) controlling the memory device to enter a power mode;
    (C) controlling the memory device to enter a function mode;
    (D) controlling the comparison circuit to compare an output data of the memory device with the test data;
    (E) waiting for a recovery signal after controlling the memory device to enter the power mode; and
    (F) controlling the memory device to enter the function mode according to the recovery signal.

2. The memory device test circuit of claim 1, wherein the control circuit further performs following steps:
    (G) disabling the memory device before controlling the memory device to enter the power mode; and
    (H) after controlling the memory device to enter the function mode, enabling the memory device.

3. The memory device test circuit of claim 2, wherein the storage circuit further stores a set value, and the control circuit further performs following step:
    (I) after controlling the memory device to enter the function mode, waiting for a period of time according to the set value before enabling the memory device, wherein the set value is associated with at least one of a type of the memory device and a type of the power mode.

4. The memory device test circuit of claim 1, wherein the control circuit further performs following step:
    (G) performing steps (A) to (D) again using an inverted data of the test data.

5. A method for testing a memory device, comprising:
    (A) writing a test data into the memory device;
    (B) controlling the memory device to enter a power mode;
    (C) controlling the memory device to enter a function mode;
    (D) comparing an output data of the memory device with the test data;
    (E) waiting for a recovery signal after controlling the memory device to enter the power mode; and
    (F) controlling the memory device to enter the function mode according to the recovery signal.

6. The method of claim 5, further comprising:
    (G) disabling the memory device before controlling the memory device to enter the power mode; and
    (H) after controlling the memory device to enter the function mode, enabling the memory device.

7. The method of claim 6, further comprising:
    (I) after controlling the memory device to enter the function mode, waiting for a period of time before enabling the memory device;
    wherein the period of time is associated with at least one of a type of the memory device and a type of the power mode.

8. The method of claim 5, further comprising:
    (G) performing steps (A) to (D) again using an inverted data of the test data.

* * * * *